US012635169B2

(12) United States Patent
Chen et al.

(10) Patent No.: US 12,635,169 B2
(45) Date of Patent: May 19, 2026

(54) SEMICONDUCTOR DEVICE INTEGRATING A HIGH ELECTRON MOBILITY TRANSISTOR AND A RESISTOR

(71) Applicant: Vanguard International Semiconductor Corporation, Hsinchu (TW)

(72) Inventors: Li-Fan Chen, Hsinchu City (TW); Shao-Chang Huang, Hsinchu City (TW); Jian-Hsing Lee, Hsinchu City (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 647 days.

(21) Appl. No.: 18/070,491

(22) Filed: Nov. 29, 2022

(65) Prior Publication Data

US 2024/0178309 A1 May 30, 2024

(51) Int. Cl.
H10D 30/47 (2025.01)
H10D 1/43 (2025.01)
H10D 62/85 (2025.01)

(52) U.S. Cl.
CPC ............. H10D 30/475 (2025.01); H10D 1/43 (2025.01); H10D 62/8503 (2025.01)

(58) Field of Classification Search
CPC .... H10D 30/475; H10D 1/43; H10D 62/8503; H10D 62/343
See application file for complete search history.

(56) References Cited

U.S. PATENT DOCUMENTS

| | | | |
|---|---|---|---|
| 8,390,091 B2 | 3/2013 | Renaud | |
| 2006/0231861 A1* | 10/2006 | Akamatsu | H10D 30/472 257/E29.05 |
| 2019/0348411 A1* | 11/2019 | Chen | H10D 1/47 |
| 2020/0381420 A1* | 12/2020 | Chen | H10D 1/716 |
| 2022/0223699 A1* | 7/2022 | Brun | H10D 64/111 |

* cited by examiner

*Primary Examiner* — Norman D Richards
*Assistant Examiner* — Ethan Edward Cutler
(74) *Attorney, Agent, or Firm* — Winston Hsu

(57) ABSTRACT

A semiconductor device includes a high electron mobility transistor (HEMT) disposed in an annular active element region, and a resistor disposed in a passive element region surrounded by the annular active element region. The HEM includes a first portion of a compound semiconductor barrier layer stacked on a first portion of a compound semiconductor channel layer. A source electrode, a gate electrode, and a drain electrode are disposed on the first portion of the compound semiconductor barrier layer. The resistor includes a second portion of the compound semiconductor barrier layer stacked on a second portion of the compound semiconductor channel layer. An input terminal electrode is disposed on the second portion of the compound semiconductor barrier layer and located at the center of the passive element region.

20 Claims, 9 Drawing Sheets

SEMICONDUCTOR DEVICE INTEGRATING A HIGH ELECTRON MOBILITY TRANSISTOR AND A RESISTOR

BACKGROUND OF THE INVENTION

1. Field of the Invention

The present disclosure relates generally to semiconductor devices, and more particularly to semiconductor devices integrating a high electron mobility transistor and a resistor.

2. Description of the Prior Art

In semiconductor technology, group III-V semiconductor compounds may be used to construct various integrated circuit (IC) devices, such as high power field-effect transistors (FETs), high frequency transistors, or high electron mobility transistors (HEMTs). A HEMT is a field effect transistor having a two dimensional electron gas (2DEG) layer close to a junction between two materials with different energy gaps (i.e., a hetero-junction). The 2DEG layer is used as the transistor channel instead of a doped region, as is generally the case for metal oxide semiconductor field effect transistors (MOSFETs). Compared with MOSFETs, HEMTs have a number of attractive properties, such as high electron mobility, the ability to transmit signals at high frequencies, high breakdown voltage and low on-resistance.

In recent years, HEMTs have been used in many applications such as battery monitoring and management systems, three-phase motor control circuits, etc. due to their high breakdown voltage and low on-resistance. In these applications, accurate sensing of high voltage side current is required, such as using a current sensing resistor. The current sensing resistor is typically a discrete component that is separated from and electrically connected to the HEMT to form an electronic circuit. However, a discrete current sensing resistor separated from the HEMT would require a relatively large footprint for the electronic circuit and also increase the manufacturing cost.

SUMMARY OF THE INVENTION

In view of this, the present disclosure provides a semiconductor device that integrates a resistor in a region where a high electron mobility transistor (HEMT) is formed, so that the resistor electrically connected to the HEMT does not occupy additional area, thereby saving the layout area of an electronic circuit. In addition, the resistors of the embodiments of the present disclosure are resistors using two-dimensional electron gas (2DEG). Compared with the silicon-based resistors, the resistors of the embodiments of the present disclosure have more precise resistance for sensing current, and have more robustness in electrical properties. Moreover, according to the embodiments of the present disclosure, the processes of forming the resistor and the HEMT may be integrated in the same process steps, thereby simplifying the fabrication of the semiconductor devices.

According to one embodiment of the present disclosure, a semiconductor device is provided and includes a high electron mobility transistor (HEMT) and a resistor. The HEMT is disposed in an annular active element region, and the resistor is disposed in a passive element region surrounded by the annular active element region. The HEMT includes a first portion of a compound semiconductor barrier layer stacked on a first portion of a compound semiconductor channel layer. In addition, a source electrode, a gate electrode, and a drain electrode are disposed on the first portion of the compound semiconductor barrier layer. The resistor includes a second portion of the compound semiconductor barrier layer stacked on a second portion of the compound semiconductor channel layer. Moreover, an input terminal electrode is disposed on the second portion of the compound semiconductor barrier layer and located at the center of the passive element region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
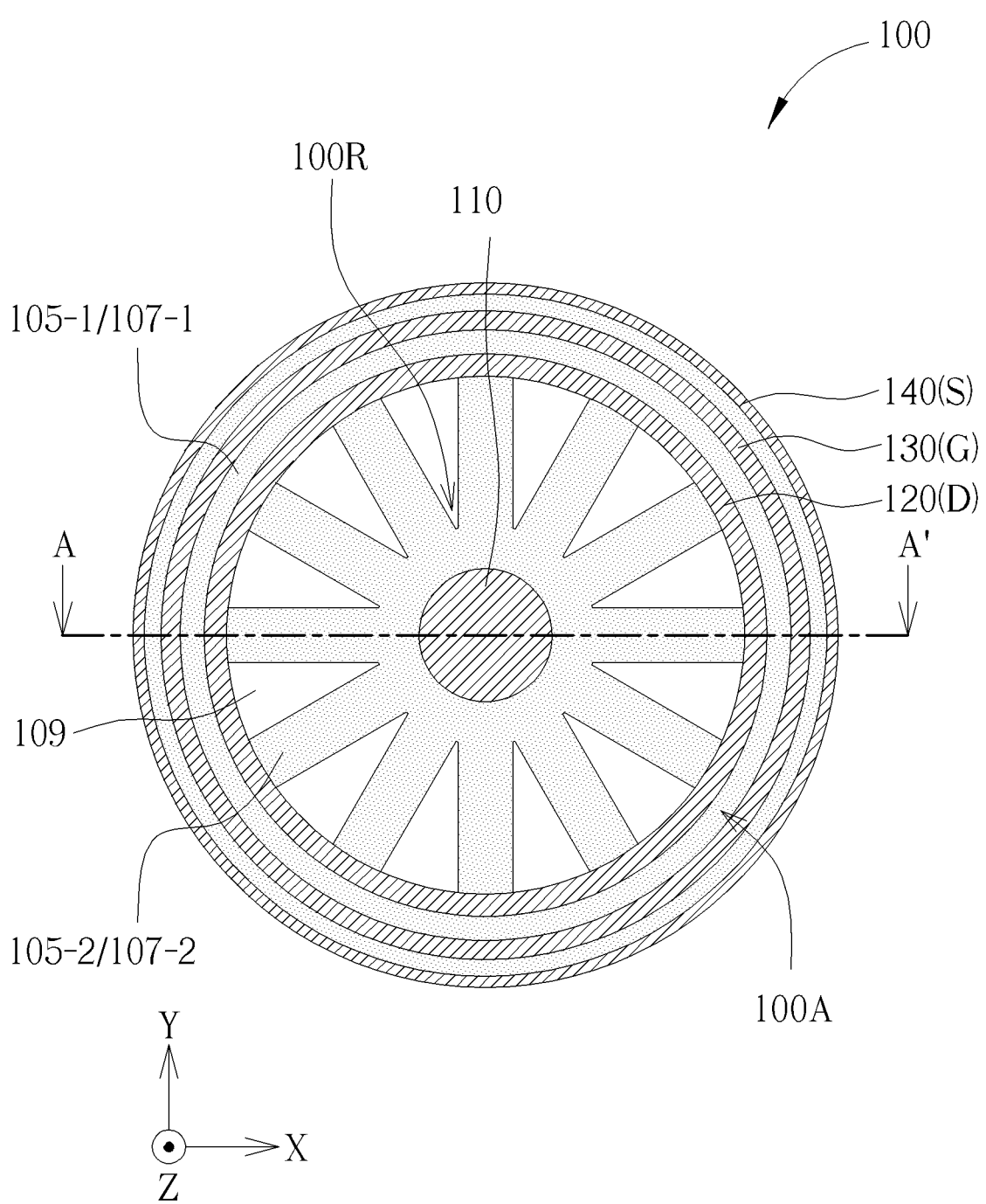
FIG. 1 is a schematic top view of a semiconductor device according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, group III-V semiconductor may contain dopants to become semiconductor with specific conductivity type, such as n-type or p-type.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to a semiconductor device integrating a high electron mobility transistor (HEMT) and a resistor. The resistor is integrated in a region where the HEMT is formed and electrically connected to the HEMT. The resistor does not occupy an additional area of the semiconductor device, thereby saving the layout area of an electronic circuit. In addition, the resistors of the embodiments of the present disclosure are two-dimensional electron gas (2DEG) resistors, which have more precise resistance for sensing current and have more robustness in electrical properties while compared with the silicon-based resistors. Moreover, according to the embodiments of the present disclosure, the processes of forming the resistor and the HEMT may be integrated in the same process steps, so that there is no need to form an additional photoresist layer for the resistor. Therefore, the process steps of fabricating the semiconductor device are simple and the manufacturing cost is reduced.

FIG. 1 is a schematic top view of a semiconductor device 100 according to an embodiment of the present disclosure. The semiconductor device 100 includes an annular active element region 100A and a passive element region 100R surrounded by the annular active element region 100A. A HEMT of the semiconductor device 100 is disposed in the annular active element region 100A, and a resistor of the semiconductor device 100 is disposed in the passive element region 100R. The HEMT includes a first portion 107-1 of a compound semiconductor barrier layer stacked on a first portion 105-1 of a compound semiconductor channel layer. As shown in FIG. 1, in one embodiment, the first portion 107-1 of the compound semiconductor barrier layer is vertically aligned with the first portion 105-1 of the compound semiconductor channel layer, and a top-view shape thereof may be a circular ring shape, i.e., the top-view shape of the annular active element region 100A may be a circular ring shape. In other embodiments, a top-view shape of the annular active element region 100A may be an elliptical annular shape, a rectangular ring shape, a polygonal ring shape, or a ring shape with other geometric shapes. In addition, the HEMT further includes a source electrode 140, a gate electrode 130 and a drain electrode 120 disposed on the first portion 107-1 of the compound semiconductor barrier layer. As shown in FIG. 1, in one embodiment, the top-view shapes of the source electrode 140, the gate electrode 130 and the drain electrode 120 are circular rings separated from each other, but not limited thereto. Alternatively, the top-view shapes of the source electrode 140, the gate electrode 130 and the drain electrode 120 may be an elliptical ring, a rectangular ring, or a polygonal ring, which are adjusted based on the top-view shape of the annular active element region 100A. In addition, the drain electrode 120 is adjacent to the passive element region 100R. The source electrode 140 is far away from the passive element region 100R. The gate electrode 130 is located between the source electrode 140 and the drain electrode 120. In some embodiments, the distance between the drain electrode 120 and the gate electrode 130 may be greater than the distance between the source electrode 140 and the gate electrode 130.

The resistor of the semiconductor device 100 includes a second portion 107-2 of the compound semiconductor barrier layer stacked on a second portion 105-2 of the compound semiconductor channel layer. The resistor further includes an input terminal electrode 110 disposed on the second portion 107-2 of the compound semiconductor barrier layer and located at the center of the passive element region 100R. As shown in FIG. 1, in one embodiment, the second portion 105-2 of the compound semiconductor channel layer is vertically aligned with the second portion 107-2 of the compound semiconductor barrier layer, and a top-view shape thereof may be a radial shape from the input terminal electrode 110 toward the drain electrode 120. The spaces of the radial shape may be filled with an insulating material 109. In some embodiments, the composition of the compound semiconductor channel layer is a group III-V semiconductor, such as gallium nitride (GaN). The composition of the compound semiconductor barrier layer is another group III-V semiconductor, such as aluminum gallium nitride (AlGaN). The stacked structure of the second portion 107-2 of the compound semiconductor barrier layer and the second portion 105-2 of the compound semiconductor channel layer in the passive element region 100R generates a two-dimensional electron gas (2DEG) adjacent to a junction between two materials with different energy gaps, i.e., 2DEG is generated in the second portion 105-2 of the compound semiconductor channel layer and close to the second portion 107-2 of the compound semiconductor barrier layer. Therefore, the resistor of the semiconductor device 100 may also be referred to as a 2DEG resistor. In this embodiment, through adjusting the ratio of the area of the radial shape of the second portion 107-2 of the radial compound semiconductor barrier layer and the second portion 105-2 of the radial compound semiconductor channel layer in the passive element region 100R, the resistance value of the resistor is changed. When the ratio of the area occupied by the radial shape is higher, the resistance value of the resistor is lower.

Figure 2:
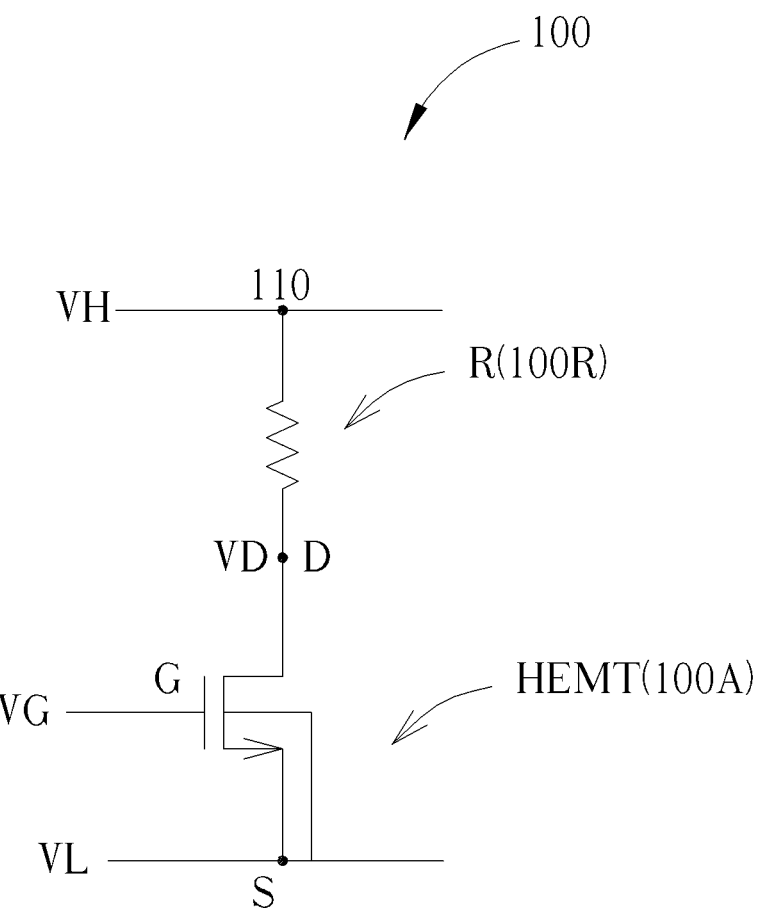
FIG. 2 is a circuit of a semiconductor device according to some embodiments of the present disclosure.

FIG. 2 is a circuit of a semiconductor device 100 according to some embodiments of the present disclosure. In the circuit of the semiconductor device 100, one end of a resistor R in the passive element region 100R is electrically coupled to the input terminal electrode 110 for receiving a high-voltage side voltage VH. Another end of the resistor R is electrically coupled to a drain electrode D of the HEMT in the annular active element region 100A. A drain voltage VD obtained from reducing the high-voltage side voltage VH by the resistor R is transmitted to the drain electrode D of the HEMT, where the potential of the input terminal electrode 110 is higher than the potential of the drain electrode D. A gate electrode G of the HEMT receives a gate voltage VG, and a source electrode S of the HEMT is electrically coupled to a low-voltage side voltage VL, such as a ground terminal. According to the embodiments of the present disclosure, the resistor R of the semiconductor device 100 is disposed at the high-voltage side of the circuit and electrically connected to the HEMT in series. Therefore, the resistor R may be used to monitor the high-voltage side current for protecting the HEMT.

Figure 3:
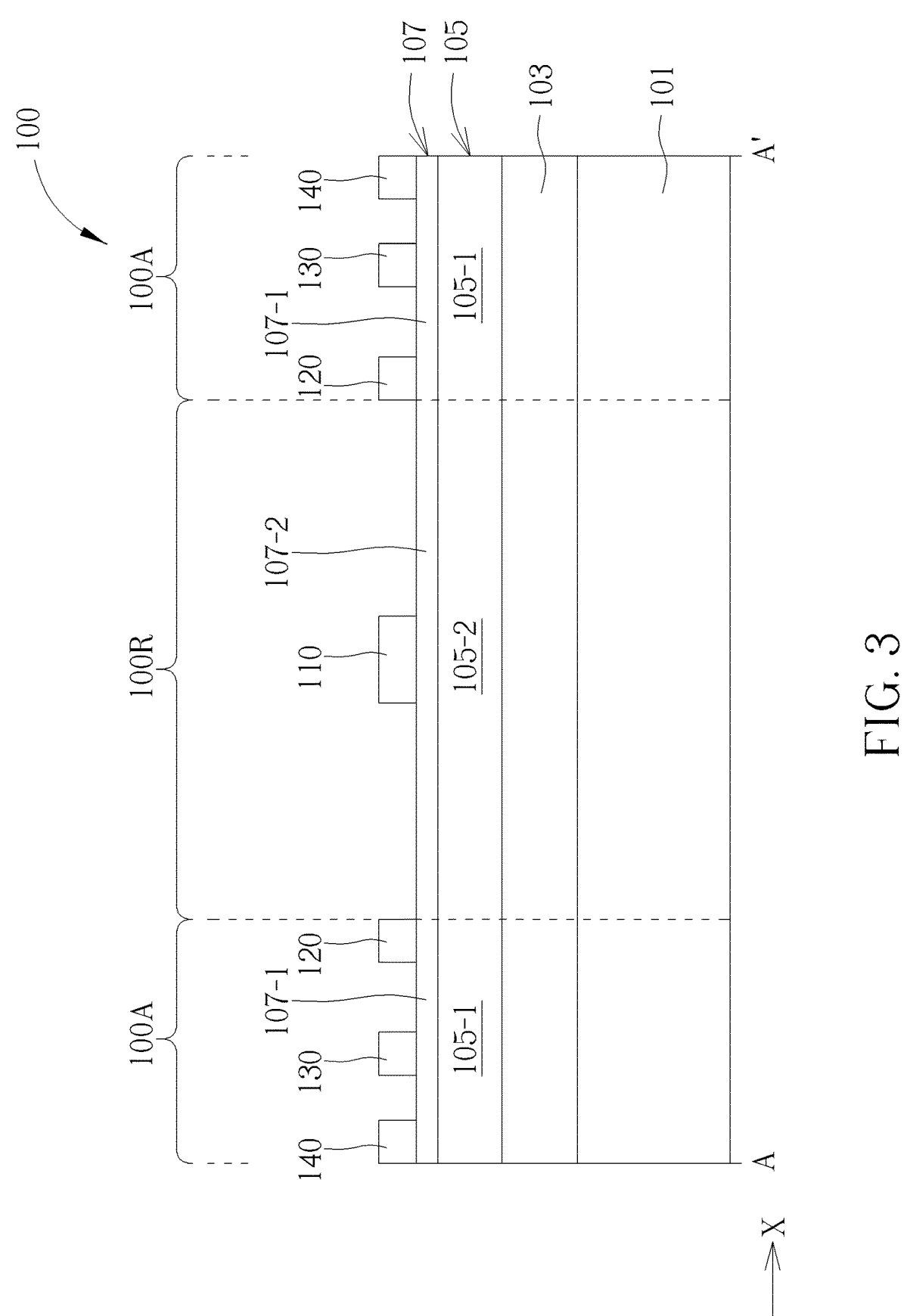
FIG. 3 is a schematic cross-sectional view of a semiconductor device along the cross-sectional line A-A' of FIG. 1 according to an embodiment of the present disclosure.

FIG. 3 is a schematic cross-sectional view of a semiconductor device 100 along the cross-sectional line A-A' of FIG. 1 according to an embodiment of the present disclosure. The semiconductor device 100 includes a substrate 101. In some embodiments, the material of the substrate 101 may include ceramic, silicon carbide (Sic), aluminum nitride (AlN), sapphire, or silicon. When the substrate 101 is made of a material with high hardness, high thermal conductivity, and low electrical conductivity, such as a ceramic substrate, it is more suitable for high-voltage semiconductor devices. The aforementioned high hardness, high thermal conductivity and low electrical conductivity of the substrate 101 are compared with these of a single-crystal silicon substrate, and the high-voltage semiconductor devices refer to semiconductor devices with an operating voltage higher than 50V. In some embodiments, the substrate 101 may be a semiconductor-on-insulator (SOI) substrate. In other embodiments, the substrate 101 may be provided by a composite substrate (or referred to as a QST substrate) composed of a core substrate wrapped around by a composite material layer. The core substrate includes ceramic, silicon carbide, aluminum nitride, sapphire or silicon. The composite material layer includes an insulating material layer and a semiconductor material layer, where the insulating material layer may be a single layer or multiple layers of silicon oxide, silicon nitride or silicon oxynitride, and the semiconductor material layer may be silicon or polysilicon. In addition, during the fabrication of the semiconductor devices, the composite material layer on the backside of the core substrate is removed by a thinning process, such as a grinding or etching process, so that the backside of the core substrate is exposed.

In addition, the semiconductor device 100 further includes a buffer layer 103, a compound semiconductor channel layer 105 and a compound semiconductor barrier layer 107 that are stacked on the substrate 101 from bottom to top in sequence. The buffer layer 103 reduces the degree of lattice mismatch or the stress between the substrate 101 and the compound semiconductor channel layer 105. In some embodiments, a nucleation layer may be disposed between the buffer layer 103 and the substrate 101, and a high resistance layer (or referred to as an electrical isolation layer) may be disposed between the buffer layer 103 and the compound semiconductor channel layer 105. The materials of the nucleation layer, the buffer layer 103 and the high resistance layer include group III-V semiconductors. In some embodiments, the nucleation layer is, for example, an aluminum nitride (AlN) layer. The buffer layer 103 may be a superlattice (SL) structure, for example, the buffer layer 103 may include a plurality of alternately stacked aluminum gallium nitride (AlGaN) layers and aluminum nitride (AlN) layers. The high resistance layer is, for example, a carbon-doped gallium nitride (c-GaN) layer. The aforementioned materials of the nucleation layer, the buffer layer 103 and the high resistance layer are for example, but not limited thereto. In addition, in some embodiments, the compound semiconductor channel layer 105 is, for example, an undoped gallium nitride (u-GaN) layer, and the compound semiconductor barrier layer 107 is a compound semiconductor layer with an energy gap greater than that of the compound semiconductor channel layer 105, such as an aluminum gallium nitride (AlGaN) layer, but not limited thereto. The compositions and structural configurations of the aforementioned compound semiconductor layers of the semiconductor device 100 may be determined according to the requirements of various semiconductor devices.

Still referring to FIG. 3, the compound semiconductor channel layer 105 of the semiconductor device 100 includes a first portion 105-1 located in the annular active element region 100A, and a second portion 105-2 located in the passive element region 100R. In addition, the compound semiconductor barrier layer 107 also includes a first portion 107-1 in the annular active element region 100A, and a second portion 107-2 in the passive element region 100R. In addition, a source electrode 140, a gate electrode 130 and a drain electrode 120 are disposed on the first portion 107-1 of the compound semiconductor barrier layer 107 in the annular active element region 100A to construct a HEMT. In some embodiments, the HEMT is an enhanced mode HEMT and a compound semiconductor cap layer (not shown) is disposed between the gate electrode 130 and the first portion 107-1 of the compound semiconductor barrier layer 107. In other embodiments, the HEMT is a depletion mode HEMT, and the gate electrode 130 may be disposed in a recess of the first portion 107-1 of the compound semiconductor barrier layer 107. In addition, an input terminal electrode 110 is disposed on the second portion 107-2 of the compound semiconductor barrier layer 107 in the passive element region 100R. A voltage such as a high-voltage side voltage is received by the input terminal electrode 110. The stacked structure of the second portion 105-2 of the compound semiconductor channel layer 105 and the second portion 107-2 of the compound semiconductor barrier layer 107 is used as a resistive material. In some embodiments, the composition of the input terminal electrode 110 may be the same as the composition of the source electrode 140 and the drain electrode 120, such as titanium (Ti), aluminum (Al), nickel (Ni), gold (Au) or a multilayered stacked structure of the aforementioned metal layers. Moreover, the source electrode 140, the drain electrode 120 and the input terminal electrode 110 may be formed at the same time by the same process steps.

Figure 4:
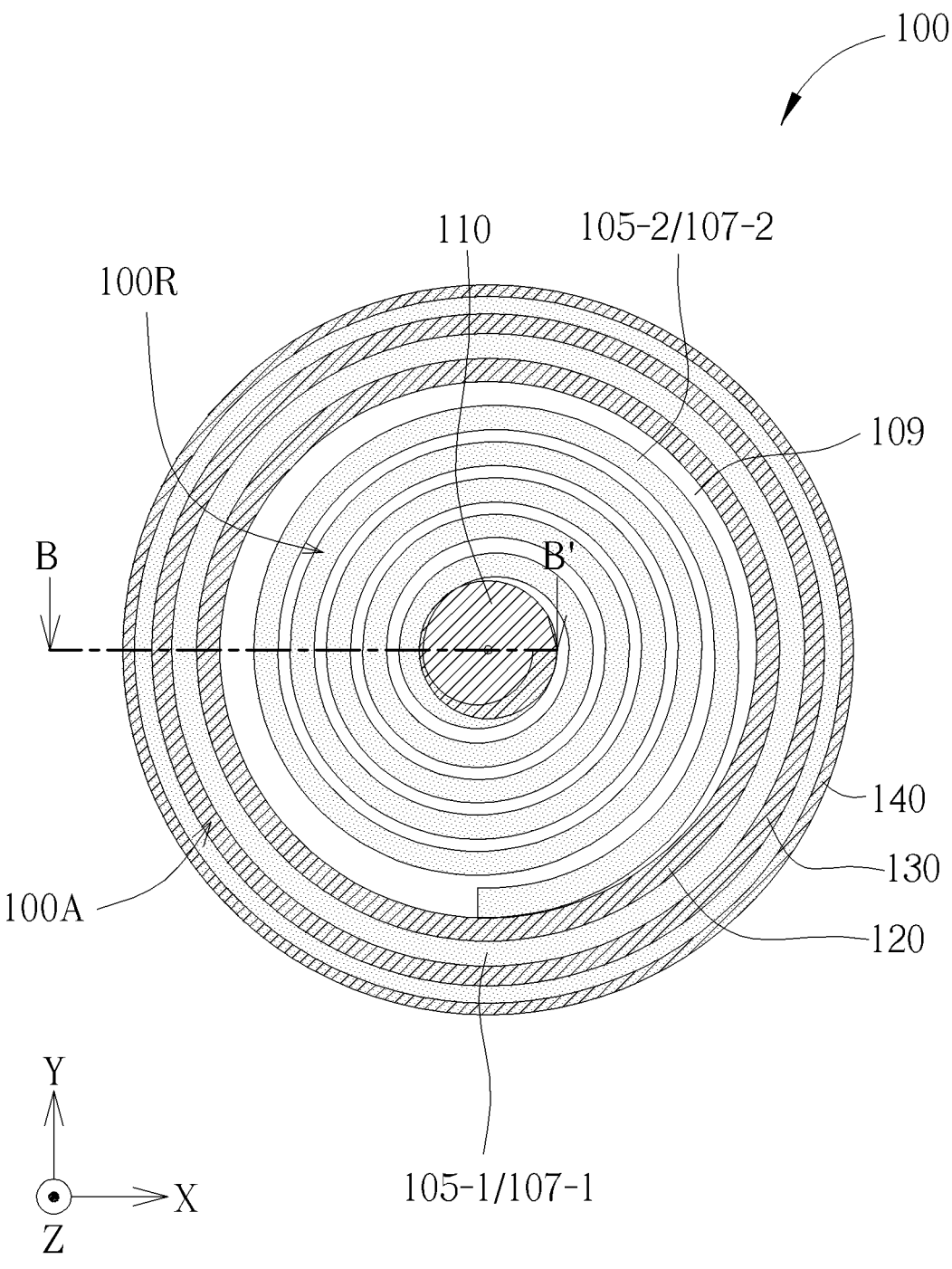
FIG. 4 is a schematic top view of a semiconductor device according to another embodiment of the present disclosure.

FIG. 4 is a schematic top view of a semiconductor device 100 according to another embodiment of the present disclosure. The difference between the semiconductor device 100 of FIG. 4 and the semiconductor device 100 of FIG. 1 is that the top-view shape of the stacked structure of the second portion 105-2 of the semiconductor channel layer 105 and the second portion 107-2 of the compound semiconductor barrier layer 107 in the passive element region 100R of the semiconductor device 100 of FIG. 4 is a spiral shape. One end of the spiral shape is connected to the input terminal electrode 110, and another end of the spiral shape is connected to the drain electrode 120, i.e., the spiral shape is from the input terminal electrode 110 to the drain electrode 120. In addition, the spaces of the spiral shape may be filled with an insulating material 109. This embodiment also utilizes the 2DEG generated by the stacked structure of the second portion 105-2 of the compound semiconductor channel layer and the second portion 107-2 of the compound semiconductor barrier layer as a resistor, and the resistor may also be referred to as a 2DEG resistor. In this embodiment, the resistance value of the resistor may be changed by adjusting the number of turns of the spiral shape. When the number of turns of the spiral shape is more, the path of the current from the input terminal electrode 110 to the drain electrode 120 is longer, and the resistance value of the resistor is higher.

Figure 5:
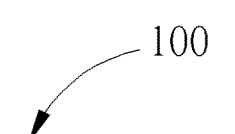
FIG. 5 is a schematic cross-sectional view of a semiconductor device along the cross-sectional line B-B' of FIG. 4 according to another embodiment of the present disclosure.

FIG. 5 is a schematic cross-sectional view of a semiconductor device 100 along the cross-sectional line B-B' of FIG. 4 according to another embodiment of the present disclosure. In the semiconductor device 100 of FIG. 5, the top-view shape of the stacked structure of the second portion 105-2 of the compound semiconductor channel layer 105 and the second portion 107-2 of the compound semiconductor barrier layer 107 in the passive element region 100R is a spiral shape. The spaces of the spiral shape are filled with an insulating material 109, for example, silicon oxide, silicon nitride or silicon oxynitride, but not limited thereto. In addition, an input terminal electrode 110 is disposed on the second portion 107-2 of the compound semiconductor barrier layer 107 in the passive element region 100R. In one embodiment, from a top view, the input terminal electrode

110 overlaps with a portion of one end of the aforementioned spiral shape and a portion of the insulating material 109.

Figure 6:
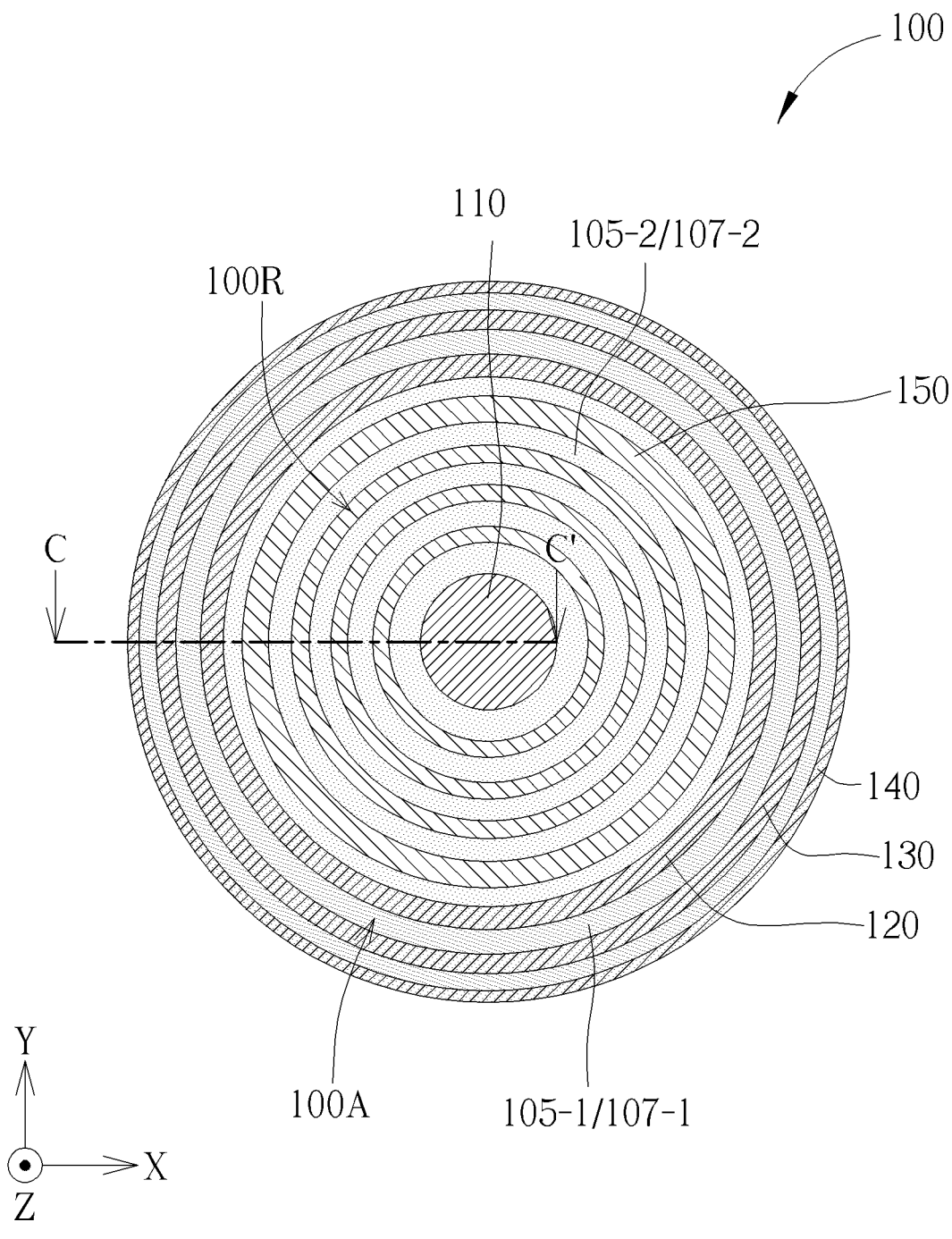
FIG. 6 is a schematic top view of a semiconductor device according to further another embodiment of the present disclosure.

FIG. 6 is a schematic top view of a semiconductor device 100 according to further another embodiment of the present disclosure. In the semiconductor device 100 of FIG. 6, the top-view shape of the stacked structure of the second portion 105-2 of the compound semiconductor channel layer and the second portion 107-2 of the compound semiconductor barrier layer in the passive element region 100R is a plurality of rings separated from each other. These separate rings are arranged in concentric circles between the input terminal electrode 110 and the drain electrode 120. In addition, the resistor in the passive element region 100R further includes a plurality of conductive rings 150 separated from each other, which are disposed on the second portion 107-2 of the compound semiconductor barrier layer. From a top view, these separate conductive rings 150 are located between those separate rings formed from the second portion 105-2 of the compound semiconductor channel layer and the second portion 107-2 of the compound semiconductor barrier layer, so as to electrically connect those separate rings in series. Furthermore, these separate conductive rings 150 are laterally separated from the input terminal electrodes 110 of the resistor. This embodiment also uses the 2DEG generated by the stacked structure of the second portion 105-2 of the compound semiconductor channel layer and the second portion 107-2 of the compound semiconductor barrier layer as the resistor and may be referred to as a 2DEG resistor. These separate conductive rings 150 are used to electrically connect those separate rings that generate 2DEG. In this embodiment, the resistance value of the resistor may be changed by adjusting the number of those separate rings. When the number of rings is more, the path of the current from the input terminal electrode 110 to the drain electrode 120 is longer, and the resistance value of the resistor is higher.

Figure 7:
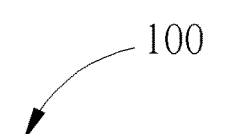
FIG. 7 is a schematic cross-sectional view of a semiconductor device along the cross-sectional line C-C' of FIG. 6 according to further another embodiment of the present disclosure.

FIG. 7 is a schematic cross-sectional view of a semiconductor device 100 along the cross-sectional line C-C' of FIG. 6 according to further another embodiment of the present disclosure. In the semiconductor device 100 of FIG. 7, the top-view shape of the stacked structure of the second portion 105-2 of the compound semiconductor channel layer 105 and the second portion 107-2 of the compound semiconductor barrier layer 107 in the passive element region 100R is a plurality of rings separated from each other. The spaces between these separate rings are filled with an insulating material 109, such as silicon oxide, silicon nitride or silicon oxynitride, but not limited thereto. In addition, an input terminal electrode 110 is disposed on the second portion 107-2 of the compound semiconductor barrier layer 107 and at the center of the passive element region 100R. In addition, a plurality of conductive rings 150 separated from each other are disposed between the input terminal electrode 110 and the drain electrode 120. From a top view, these conductive rings 150 partially overlap with the aforementioned separate rings. The input terminal electrode 110 is located directly above a portion of the insulating material 109. These conductive rings 150 are located directly above another portion of the insulating material 109. In some embodiments, the composition of the input terminal electrode 110 and the conductive rings 150 may be the same as the composition of the source electrode 140 and the drain electrode 120, such as titanium (Ti), aluminum (Al), nickel (Ni), gold (Au) or a multilayered stacked structure of the aforementioned metal layers. Moreover, the source electrode 140, the drain electrode 120, the input terminal electrode 110 and these conductive rings 150 may be formed at the same time by using the same process steps.

Figure 8:
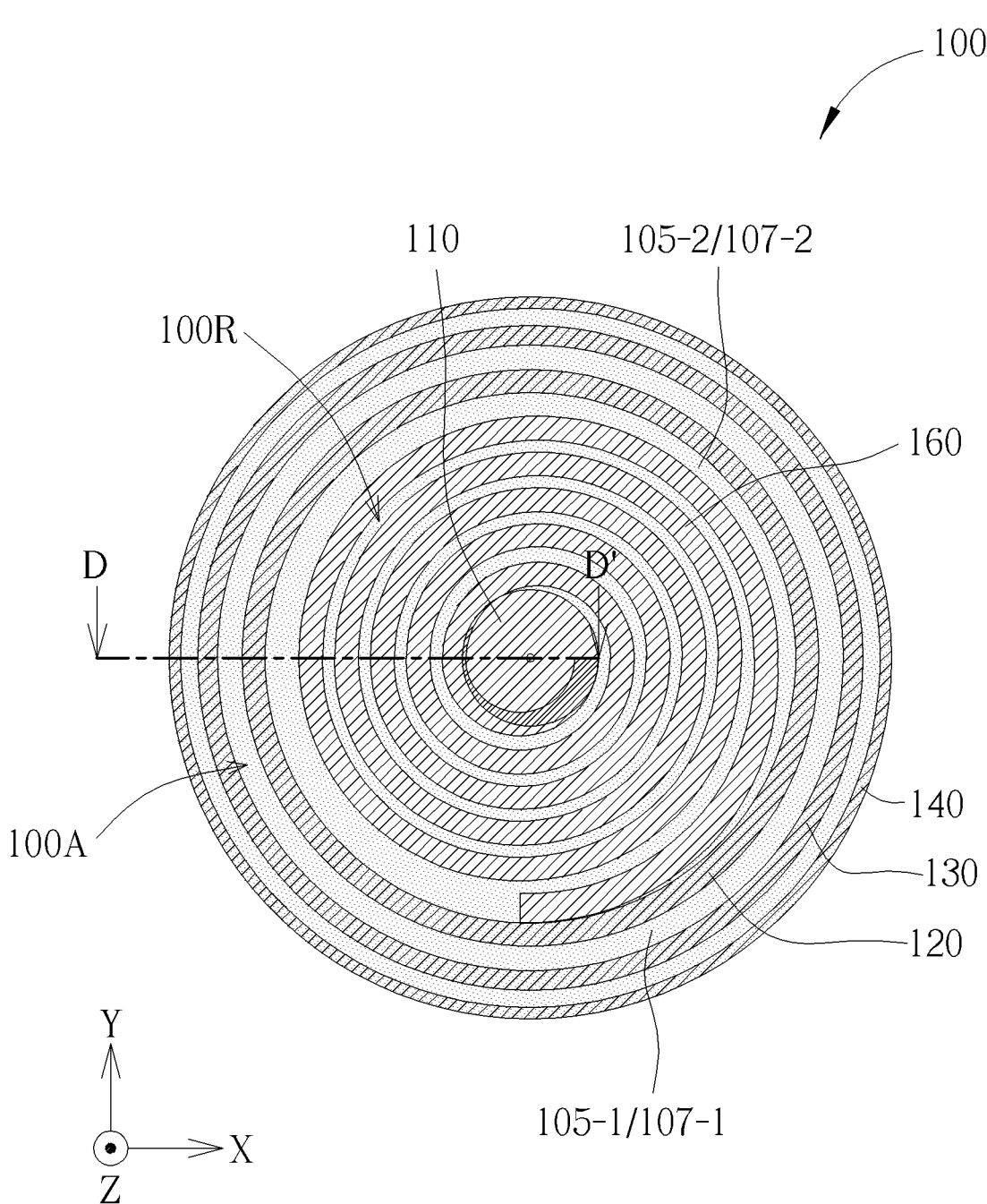
FIG. 8 is a schematic top view of a semiconductor device according to yet another embodiment of the present disclosure.

FIG. 8 is a schematic top view of a semiconductor device 100 according to yet another embodiment of the present disclosure. In the semiconductor device 100 of FIG. 8, the top-view shape of the stacked structure of the second portion 105-2 of the compound semiconductor channel layer and the second portion 107-2 of the compound semiconductor barrier layer in the passive element region 100R is a circle. The input terminal electrode 110 is located at the center of the circle. In addition, the resistor in the passive element region 100R further includes a spiral conductor 160 from the input terminal electrode 110 to the drain electrode 120. The spiral conductor 160 is disposed on the second portion 107-2 of the compound semiconductor barrier layer. In this embodiment, the 2DEG generated by the stacked structure of the second portion 105-2 of the compound semiconductor channel layer and the second portion 107-2 of the compound semiconductor barrier layer may also be used as a resistor, and the resistor may be referred to as a 2DEG resistor. Moreover, the spiral conductor 160 from the input terminal electrode 110 to the drain electrode 120 may be used as one path of current, thereby adjusting the resistance value of the resistor through the spiral conductor 160. For example, the number of turns of the spiral conductor 160 may be increased to enhance the resistance value of the resistor.

In some embodiments, an insulating doped region may be formed in the second portion 105-2 of the compound semiconductor channel layer and the second portion 107-2 of the compound semiconductor barrier layer to form a 2DEG resistor. The 2DEG resistor has a top-view shape of a radial shape, a spiral shape, or a concentric shape from the input terminal electrode 110 to the drain electrode 120. The insulating doped region may be formed by, for example, applying an external energy to disturb the lattice of the second portion 105-2 of the compound semiconductor channel layer and the second portion 107-2 of the compound semiconductor barrier layer, or using an ion implantation process to implant specific non-conductive dopants into the second portion 105-2 of the compound semiconductor channel layer and the second portion 107-2 of the compound semiconductor barrier layer.

Figure 9:
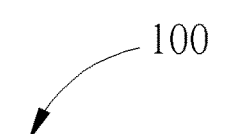
FIG. 9 is a schematic cross-sectional view of a semiconductor device along the cross-sectional line D-D' of FIG. 8 according to yet another embodiment of the present disclosure.

FIG. 9 is a schematic cross-sectional view of a semiconductor device 100 along the cross-sectional line D-D' of FIG. 8 according to yet another embodiment of the present disclosure. In the semiconductor device 100 of FIG. 9, the input terminal electrode 110 and the spiral conductor 160 are both disposed on the second portion 107-2 of the compound semiconductor barrier layer in the passive element region 100R. Moreover, the input terminal electrode 110 is in contact with a portion of one end of the spiral conductor 160 to be connected with each other. In one embodiment, the input terminal electrode 110 and the spiral conductor 160 may be formed of the same conductive layer, for example, by depositing and patterning the same metal layer to form the input terminal electrode 110 and the spiral conductor 160 at the same time. The composition of the input terminal electrode 110 and the spiral conductor 160 is, for example, metal or polysilicon.

The semiconductor devices of the embodiments of the present disclosure integrate a resistor and a HEMT, where the resistor is a 2DEG resistor, and the resistor is disposed in a region where the HEMT is formed. Accordingly, the resistor does not occupy an additional area, thereby saving the layout area of an electronic circuit of the semiconductor device. Moreover, while compared with silicon-based resistors, the 2DEG resistors of the embodiments of the present disclosure are more accurate for sensing current, and more robust and durable in electrical properties. In the embodiments of the present disclosure, one end of the resistor may be electrically coupled to the high-voltage side of the electronic circuit, and another end of the resistor may be electrically coupled to the drain electrode of the HEMT, so that the resistor may be used for high-voltage side current monitoring to protect the HEMT. In addition, according to the embodiments of the present disclosure, the processes of forming the resistor and the HEMT may be integrated together without the need to form an additional photoresist layer and nor to perform additional photolithography and etching processes, so that the resistor and the HEMT may be fabricated at the same time. Therefore, according to the embodiments of the present disclosure, the process steps of fabricating the semiconductor devices are simple and the manufacturing cost is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a high electron mobility transistor, disposed in an annular active element region and comprising:
      a first portion of a compound semiconductor channel layer;
      a first portion of a compound semiconductor barrier layer stacked on the first portion of the compound semiconductor channel layer; and
      a source electrode, a gate electrode and a drain electrode, disposed on the first portion of the compound semiconductor barrier layer; and
   a resistor, disposed in a passive element region surrounded by the annular active element region and comprising:
      a second portion of the compound semiconductor channel layer;
      a second portion of the compound semiconductor barrier layer stacked on the second portion of the compound semiconductor channel layer; and
      an input terminal electrode, disposed on the second portion of the compound semiconductor barrier layer and located at the center of the passive element region.

2. The semiconductor device of claim 1, wherein the resistor is a two-dimensional electron gas, and a top-view shape of the resistor comprises a radial shape, a spiral shape, or a concentric shape from the input terminal electrode to the drain electrode.

3. The semiconductor device of claim 1, wherein one end of the resistor is electrically coupled to the input terminal electrode and another end of the resistor is electrically coupled to the drain electrode.

4. The semiconductor device of claim 1, wherein the second portion of the compound semiconductor channel layer of the resistor is vertically aligned with the second portion of the compound semiconductor barrier layer, and a top-view shape of the resistor comprises a radial shape from the input terminal electrode toward the drain electrode.

5. The semiconductor device of claim 4, wherein spaces of the radial shape are filled with an insulating material.

6. The semiconductor device of claim 1, wherein the second portion of the compound semiconductor channel layer of the resistor is vertically aligned with the second portion of the compound semiconductor barrier layer, and a top-view shape of the resistor comprises a spiral shape from the input terminal electrode to the drain electrode, and spaces of the spiral shape are filled with an insulating material.

7. The semiconductor device of claim 1, wherein the second portion of the compound semiconductor channel layer of the resistor is vertically aligned with the second portion of the compound semiconductor barrier layer, and a top-view shape of the resistor comprises a plurality of rings separated from each other and arranged in concentric circles between the input terminal electrode and the drain electrode.

8. The semiconductor device of claim 7, wherein the resistor further comprises a plurality of conductive rings separated from each other and disposed on the second portion of the compound semiconductor barrier layer, from a top view, the plurality of conductive rings are located between the plurality of rings and electrically connect the plurality of rings in series.

9. The semiconductor device of claim 8, wherein the plurality of conductive rings are laterally separated from the input terminal electrode.

10. The semiconductor device of claim 8, wherein spaces between the plurality of rings are filled with an insulating material.

11. The semiconductor device of claim 10, wherein the input terminal electrode is located above a portion of the insulating material and the plurality of conductive rings are located above another portion of the insulating material.

12. The semiconductor device of claim 8, wherein from a top view, the plurality of conductive rings is partially overlapped with the plurality of rings.

13. The semiconductor device of claim 1, wherein the second portion of the compound semiconductor channel layer is vertically aligned with the second portion of the compound semiconductor barrier layer of the resistor, a top view shape of the resistor comprises a circle, and the input terminal electrode is located at the center of the circle.

14. The semiconductor device of claim 13, wherein the resistor further comprises a spiral conductor from the input terminal electrode to the drain electrode and disposed on the second portion of the compound semiconductor barrier layer.

15. The semiconductor device of claim 14, wherein the composition of the spiral conductor comprises metal or polysilicon.

16. The semiconductor device of claim 1, wherein top view shapes of the source electrode, the gate electrode and the drain electrode comprise three rings separated from each other.

17. The semiconductor device of claim 1, wherein the first portion of the compound semiconductor channel layer is vertically aligned with the first portion of the compound semiconductor barrier layer of the high electron mobility transistor (HEMT), and a top-view shape of the HEMT comprises a ring shape.

18. The semiconductor device of claim 1, wherein a top-view shape of the annular active element region comprises a circular ring, an elliptical ring, a rectangular ring or a polygonal ring.

19. The semiconductor device of claim 1, wherein the composition of the compound semiconductor channel layer comprises gallium nitride (GaN), and the composition of the compound semiconductor barrier layer comprises aluminum gallium nitride (AlGaN).

20. The semiconductor device of claim 1, wherein a potential of the input terminal electrode is higher than a potential of the drain electrode.

* * * * *